(12) United States Patent
Wiegand et al.

(10) Patent No.: US 10,079,266 B2
(45) Date of Patent: Sep. 18, 2018

(54) MODULATION OF MAGNETIC PROPERTIES THROUGH IMPLANTATION AND ASSOCIATED STRUCTURES

(71) Applicant: Intel Corporation, Santa Clara, CA (US)

(72) Inventors: Christopher J. Wiegand, Portland, OR (US); Md Tofizur Rahman, Portland, OR (US); Oleg Golonzka, Beaverton, OR (US); Anant H. Jahagirdar, Hillsboro, OR (US); Mengcheng Lu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/122,129

(22) PCT Filed: Mar. 28, 2014

(86) PCT No.: PCT/US2014/032240
§ 371 (c)(1),
(2) Date: Aug. 26, 2016

(87) PCT Pub. No.: WO2015/147875
PCT Pub. Date: Oct. 1, 2015

(65) Prior Publication Data
US 2017/0005136 A1    Jan. 5, 2017

(51) Int. Cl.
*H01L 27/22* (2006.01)
*H01L 43/12* (2006.01)
(Continued)

(52) U.S. Cl.
CPC .......... *H01L 27/222* (2013.01); *G11C 11/161* (2013.01); *H01L 43/02* (2013.01);
(Continued)

(58) Field of Classification Search
CPC ....... G11C 11/161; G11C 11/15; G11C 19/08; G11C 14/0036; G11C 14/0081;
(Continued)

(56) References Cited

U.S. PATENT DOCUMENTS

2003/0175997 A1   9/2003   Kyler et al.
2004/0175848 A1   9/2004   Chen et al.
(Continued)

FOREIGN PATENT DOCUMENTS

CN   102422421 A   4/2012

OTHER PUBLICATIONS

International Search Report and Written Opinion dated Dec. 16, 2014, issued in corresponding International Application No. PCT/US2014/032240, 12 pages.
(Continued)

*Primary Examiner* — Cuong B Nguyen
(74) *Attorney, Agent, or Firm* — Schwabe, Williamson & Wyatt, P.C.

(57) ABSTRACT

Embodiments of the present disclosure describe techniques and configurations associated with modulation of magnetic properties through implantation. In one embodiment, a method includes providing a substrate having an integrated circuit (IC) structure disposed on the substrate, the IC structure including a magnetizable material, implanting at least a portion of the magnetizable material with a dopant and magnetizing the magnetizable material, wherein said magnetizing is inhibited in the implanted portion of the magnetizable material. Other embodiments may be described and/or claimed.

9 Claims, 6 Drawing Sheets (51) Int. Cl.
*G11C 11/16* (2006.01)
*H01L 43/02* (2006.01)
*H01L 43/08* (2006.01)
*H01L 43/10* (2006.01)

(52) U.S. Cl.
CPC .............. *H01L 43/08* (2013.01); *H01L 43/10* (2013.01); *H01L 43/12* (2013.01)

(58) Field of Classification Search
CPC ......... H01L 43/10; H01L 43/02; H01L 43/08; H01L 43/12; H01L 27/222–27/228; H01L 43/00–43/14
See application file for complete search history.

(56) References Cited

U.S. PATENT DOCUMENTS

| | | |
|---|---|---|
| 2005/0277206 A1 | 12/2005 | Gaidis et al. |
| 2009/0104718 A1 | 4/2009 | Zhong et al. |
| 2010/0289098 A1 | 11/2010 | Li et al. |
| 2012/0007227 A1* | 1/2012 | Cho .................... H01L 21/568 257/686 |
| 2012/0187510 A1 | 6/2012 | Jung et al. |
| 2012/0276658 A1 | 11/2012 | Godet et al. |
| 2013/0069186 A1 | 3/2013 | Toko et al. |
| 2013/0175644 A1 | 7/2013 | Horng et al. |
| 2013/0248355 A1 | 9/2013 | Ohsawa et al. |
| 2013/0285177 A1 | 10/2013 | Kontos et al. |
| 2013/0288394 A1* | 10/2013 | Kontos .................. H01L 43/02 438/3 |
| 2014/0016404 A1 | 1/2014 | Kim et al. |
| 2014/0038311 A1* | 2/2014 | Kim ....................... H01L 43/12 438/3 |
| 2015/0069560 A1* | 3/2015 | Cho ........................ H01L 43/02 257/421 |

OTHER PUBLICATIONS

Taiwan Office Action and Search Report dated May 24, 2016, issued in corresponding Taiwan Patent Application No. 104105651.
International Preliminary Report on Patentability dated Oct. 13, 2016, issued in corresponding International Application No. PCT/US2014/032240, 9 pages.
2nd Office Action in Primary Examination dated Sep. 21, 2016, issued in Taiwan Patent Application No. 104105651, 12 pages.
Decision of Rejection in Primary Examination dated Feb. 9, 2017, issued in Taiwan Patent Application No. 04105651, 9 pages.
Extended European Search Report dated Oct. 20, 2017 for European Patent Application No. 14887179.1, 8 pages.

* cited by examiner

MODULATION OF MAGNETIC PROPERTIES THROUGH IMPLANTATION AND ASSOCIATED STRUCTURES

CROSS-REFERENCE TO RELATED APPLICATION

The present application is a national phase entry under 35 U.S.C. § 371 of International Application No. PCT/US2014/032240, filed Mar. 28, 2014, entitled "MODULATION OF MAGNETIC PROPERTIES THROUGH IMPLANTATION AND ASSOCIATED STRUCTURES," which designates the United States of America, the entire disclosure of which is hereby incorporated by reference in its entirety and all purposes.

FIELD

Embodiments of the present disclosure generally relate to the field of integrated circuits, and more particularly, to techniques and configurations associated with modulation of magnetic properties through implantation.

BACKGROUND

Integrated circuit (IC) structures such as transistors continue to scale to smaller dimensions to provide smaller dies and devices with greater performance. Currently, some IC structures such as, for example, bit array structures of magnetic random access memory (MRAM) may include magnetic material that is lithographically patterned and removed by etch to define boundaries of the magnetic material in the MRAM. However, difficulties may arise in defining boundaries of the magnetic material with nanometer-scale precision using current patterning techniques such as, for example, reactive ion etch owing to damaging effects of such etch and/or difficulty in volatilizing magnetic materials.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe techniques and configurations associated with modulation of magnetic properties through implantation. In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

Figure 1:
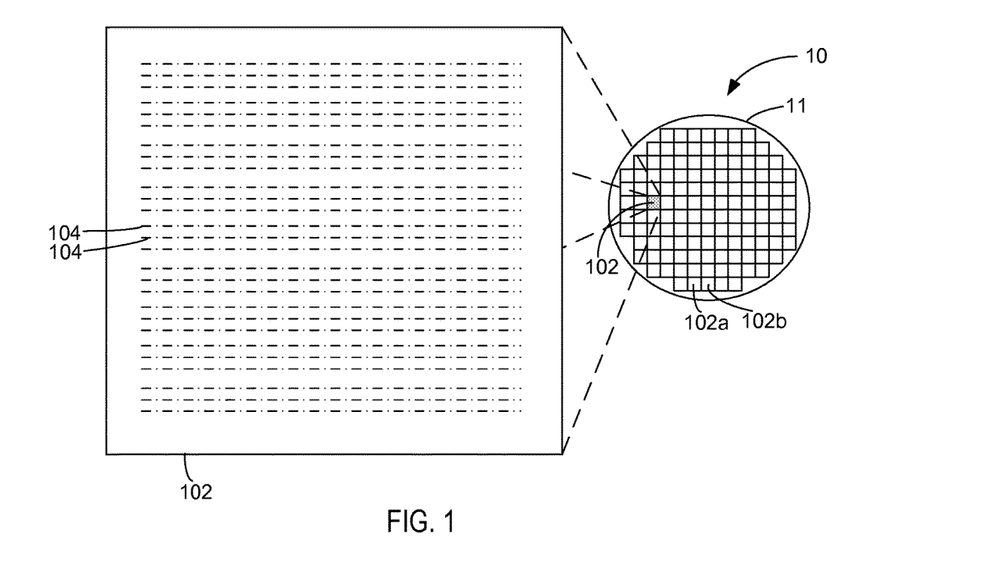
FIG. 1 schematically illustrates a top view of an example die in wafer form and in singulated form, in accordance with some embodiments.

FIG. 1 schematically illustrates a top view of an example die 102 in wafer form 10 and in singulated form 100, in accordance with some embodiments. In some embodiments, the die 102 may be one of a plurality of dies (e.g., dies 102, 102a, 102b) of a wafer 11 composed of semiconductor material such as, for example, silicon or other suitable material. The plurality of dies may be formed on a surface of the wafer 11. Each of the dies may be a repeating unit of a semiconductor product that includes magnetic material that is modulated according to techniques described herein.

Circuitry such as, for example, transistor elements 104 may be formed on the die 102. The transistor elements 104 may include, for example, one or more integrated circuit (IC) structures (e.g., IC structure 300 of FIGS. 3a-f). Transistor elements 104 described herein may be incorporated in a die 102 for logic or memory, or combinations thereof. In some embodiments, the transistor elements 104 may be part of a system-on-chip (SoC) assembly. In some embodiments, the transistor elements 104 may represent bit array structures of magnetic random access memory (MRAM). Although the transistor elements 104 are depicted in rows that traverse a substantial portion of the die 102 in FIG. 1, subject matter is not limited in this regard, and any other suitable arrangement of the transistor elements 104 on the die 102 may be implemented according to various embodiments.

After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the transistor elements 104 may be disposed on a semiconductor substrate in wafer form 10 or singulated form 100.

Figure 2:
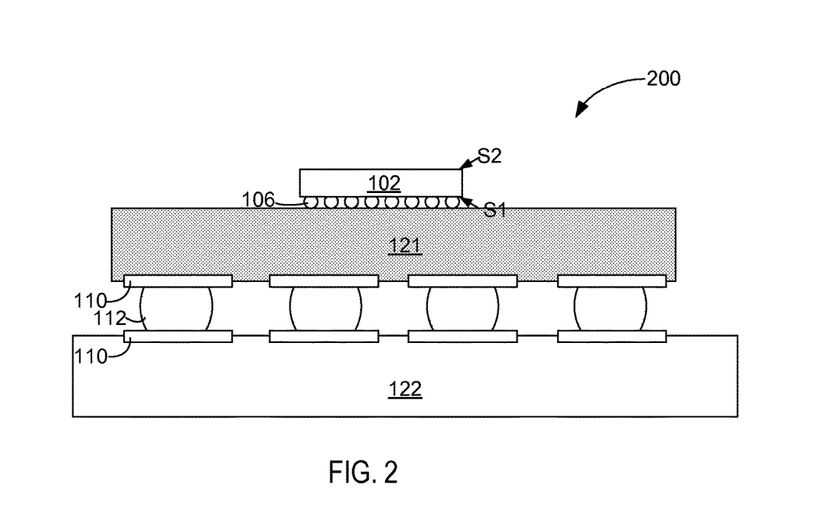
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. The die 102 may include transistor elements (e.g., transistor elements 104 of FIG. 1) and/or an IC structure (e.g., IC structure 300 of FIGS. 3a-f) as described herein. In some embodiments, the package substrate 121 may be electrically coupled with a circuit board 122, as can be seen.

The die 102 may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In some embodiments, the die 102 may be, include, or be a part of a processor, memory, SoC, or ASIC. In some embodiments, an electrically insulative material such as, for example, molding compound or underfill material (not shown) may encapsulate at least a portion of the die 102 and/or die interconnect structures 106.

The die 102 can be attached to the package substrate 121 according to a wide variety of suitable configurations, including, for example, being directly coupled with the package substrate 121 in a flip-chip configuration, as depicted. In the flip-chip configuration, an active side, S1, of the die 102 is attached to a surface of the package substrate 121 using die interconnect structures 106 such as bumps, pillars, or other suitable structures that may also electrically couple the die 102 with the package substrate 121. The active side S1 of the die 102 may include circuitry such as, for example, transistor elements 104 of FIG. 1 and/or IC structure 300 of FIGS. 3a-f. An inactive side, S2, may be disposed opposite to the active side S1, as can be seen.

In some embodiments, the die interconnect structures 106 may be configured to route electrical signals between the die and the package substrate 121. The electrical signals may include, for example, input/output (I/O) signals and/or power/ground signals that are used in connection with operation of the die.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments, including, for example, substrates formed from glass, ceramic, or semiconductor materials.

The package substrate 121 may include electrical routing features configured to route electrical signals to or from the die 102. The electrical routing features may include, for example, pads 110 or traces (not shown) disposed on one or more surfaces of the package substrate 121 and/or internal routing features (not shown) such as, for example, trenches, vias, or other interconnect structures to route electrical signals through the package substrate 121. For example, in some embodiments, the package substrate 121 may include electrical routing features such as pads (not shown) configured to receive the respective die interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as a composite epoxy material (CEM) (e.g., CEM-1 or CEM-3), or woven glass materials that are laminated together using an epoxy resin prepreg material. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 602 of FIG. 6).

Package-level interconnects such as, for example, solder balls 112 may be coupled to one or more pads pads 110 on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

The IC assembly 200 may include a wide variety of other suitable configurations in other embodiments, including, for example, suitable combinations of flip-chip and/or wire-bonding configurations, interposers, and multi-chip package configurations including system-in-package (SiP) and/or package-on-package (PoP) configurations. Other suitable techniques to route electrical signals between the die 102 and other components of the IC assembly 200 may be used in some embodiments.

Figure 3A:
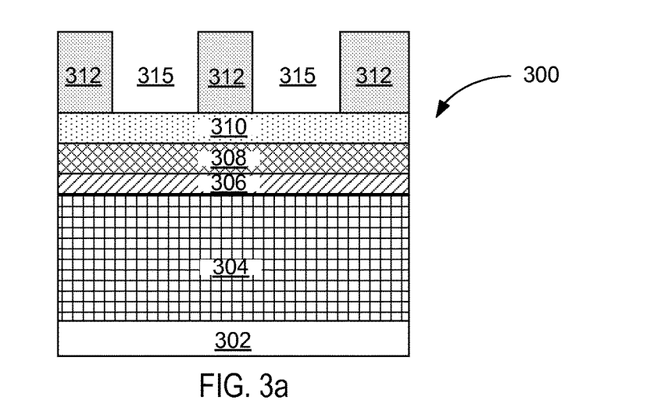
FIGS. 3a-f schematically illustrate cross-section side views of an integrated circuit (IC) structure during various stages of fabrication, in accordance with some embodiments.

FIGS. 3a-f schematically illustrate cross-section side views of an integrated circuit (IC) structure 300 during various stages of fabrication, in accordance with some embodiments. Referring to FIG. 3a, an IC structure 300 is depicted subsequent to forming a stack of layers (e.g., layers 304, 306, 308, 310) on a substrate 302 and patterning a masking layer 312 that is disposed on the stack of layers to provide one or more openings 315 in the masking layer 312 over the stack of layers.

In some embodiments, the substrate 302 may be a semiconductor substrate (e.g., of a die 102 of FIG. 1) such as, for example, silicon or another suitable semiconductor material. The IC structure 300 may include one or more magnetic base layers 304 disposed on the substrate 302, a template layer or tunnel barrier layer 306 disposed on the one or more magnetic base layers, a magnetic layer 308 disposed on the template layer or tunnel barrier layer 306, and a barrier layer 310 disposed on the magnetic layer 308.

According to various embodiments, the one or more magnetic base layers 304 may be deposited on the substrate 302 to promote adhesion between subsequent layers (e.g., tunnel barrier layer 306) and the substrate 302. In some embodiments, the one or more magnetic base layers 304 may include one or more of tantalum (Ta), ruthenium (Ru), platinum (Pt), manganese (Mn), cobalt (Co), iron (Fe), nickel (Ni), or boron (B), including alloys thereof. In some embodiments, the one or more magnetic base layers 304 may be composed of a magnetizable material that is magnetized during anneal/magnetization as described further in connection with FIG. 3c.

The tunnel barrier layer 306 may be deposited on the one or more magnetic base layers 304. In some embodiments, the tunnel barrier layer 306 may serve as a tunnel barrier in a magnetic tunnel junction (MTJ). The tunnel barrier layer 306 may be composed of a wide variety of suitable materials, including, for example, magnesium oxide (MgO), magnesium boron oxide (MgBO), aluminum oxide ($Al_2O_3$), or other like materials. In some embodiments, an area resistance (RA) may be determined by a thickness of the tunnel barrier layer 306. In some embodiments, the RA of the IC structure 300 may be about 10 ohm/$\mu m^2$. The RA of the IC structure 300 may have other suitable values in other embodiments.

The magnetic layer 308 may be deposited on the tunnel barrier layer 306. According to various embodiments, the magnetic layer 308 may be composed of a magnetizable or magnetized material including, for example, ferromagnetic materials. For example, the magnetic layer 308 may be composed of a ferromagnetic material such as, for example, cobalt (Co), iron (Fe), nickel (Ni), an alloy of two or more of Co, Fe, or Ni with or without boron (B) (e.g., CoFe, CoFeB, or NiFe) or like materials.

The barrier layer 310 may be deposited on the magnetic layer 308 to prevent or reduce oxidation of the underlying layers (e.g., layers 308, 306, 304). According to various embodiments, the barrier layer 310 may be composed of a metal or metal nitride such as, for example, tantalum (Ta), titanium (Ti), titanium nitride (TiN), or like materials. In some embodiments, an implant control layer (not shown) may be disposed on the barrier layer 310 to control a depth of implant. For example, the implant control layer may include carbon-doped silicon nitride (SiN) and the like.

According to various embodiments, the IC structure 300 may include other suitable layers disposed between the depicted layers, or each of the depicted layers may represent multiple layers. For example, in some embodiments, principles described herein to modulate magnetic properties may be used in connection with other suitable IC structures that include magnetizable or magnetized material. The layers (e.g., 304, 306, 308, 310) on the substrate 302 may be composed of other suitable materials in other embodiments.

In some embodiments, the masking layer 312 may represent a patterned hardmask layer with openings 315 formed to expose corresponding portions of the underlying IC structure 300. The masking layer 312 may be patterned using, for example, lithography and/or etch processes. In some embodiments, the masking layer 312 may be composed of silicon oxide ($SiO_2$) or silicon nitride (SiN) or another suitable material.

Figure 3B:
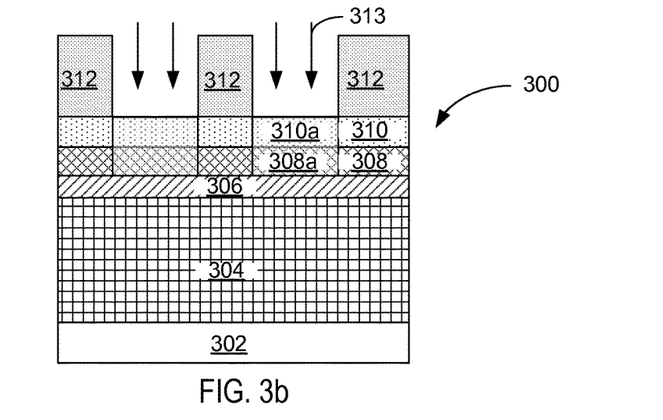

Referring to FIG. 3b, the IC structure 300 of FIG. 3a is depicted subsequent to implanting (e.g., depicted by arrows 313) the exposed portions of the IC structure 300 with a dopant through openings 315. The implanted portions of the IC structure 300 may include the dopant. For example, in the depicted embodiment of FIG. 3b, the implantation extends through the barrier layer 310 into the magnetic layer 308 to provide portions 310a, 308a of the respective layers 310, 308 that are doped by the implant. In some embodiments, the implant may extend into layers 306 and/or 304 to provide portions of these layers that are doped by the implant.

Implanting a magnetic material (e.g., of the magnetic layer 308) may create disorder in an atomic lattice structure of the magnetic material, which may permanently remove ferromagnetism in the implanted region. In some embodiments, the portions 308a, 310a may be changed from a crystalline structure to an amorphous structure by the implantation. Through use of the patterned masking layer 312, magnetism can be prevented and/or reduced in selected areas of the magnetic material in the IC structure 300 (e.g., in selected areas of magnetic bit arrays). The removal of the magnetism by implant may persist even after annealing the magnetic material in the presence of a strong magnetic field. For example, Table 1 shows values for a reduction in magnetic moment of a sample IC structure for various dopant species. The sample IC structure in each case was annealed above 350° C. for 2 hours under a 1 Tesla magnetic field following implantation.

TABLE 1

| Species | Atomic mass (amu) | Energy (KeV) | Dose (ions/$cm^2$) | Moment (emu/cc) | % Moment reduction |
| --- | --- | --- | --- | --- | --- |
| Control |  |  |  | 1200 |  |
| B | 10.8 | 3 | 1.00E+16 | 900 | 25% |
| C | 12 | 3.5 | 1.00E+16 | 870 | 28% |
| N | 14 | 4.5 | 1.00E+16 | 830 | 31% |
| P | 31 | 9 | 1.00E+16 | 250 | 79% |
| Ge | 72.6 | 15 | 1.00E+16 | 55 | 95% |
| Xe | 131.3 | 25 | 1.00E+16 | 45 | 96% |

The sample IC structure of Table 1 includes a magnetic base layer 304 composed of Ta and having a thickness of 30 angstroms, a tunnel barrier layer 306 composed of MgO and having an RA of about 10 ohm/$\mu m^2$, a magnetic layer 308 composed of Co(60%)Fe(20%)B(20%) and having a thickness of 25 angstroms, a barrier layer 310 composed of Ta and having a thickness of 30 angstroms, and an implant control layer disposed on the barrier layer 310, the implant control layer being composed of carbon-doped SiN and having a thickness of 100 angstroms. Table 1 lists the magnetic moment of a control sample ("Control"), which received no implantation, and data for samples doped with boron (B), carbon (C), nitrogen (N), phosphorous (P), germanium (Ge), and xenon (Xe). The corresponding atomic mass in atomic mass units (amu) for each species is listed along with a corresponding energy in kilo electron volts (KeV) and dose in ions/$cm^2$ of the implantation. Subsequent to implantation, the sample IC structure for each of the various dopant species was annealed above 350° C. for 2 hours under a 1 Tesla magnetic field. The magnetic moment was measured in units of volume magnetization (emu/cubic centimeter) using a superconducting quantum interference device (SQUID). The % moment reduction for each of the implanted species relative to the control sample is shown in the rightmost column of Table 1.

According to various embodiments, magnetic material (e.g., magnetic layer 308 of FIG. 3b) may be implanted with one or more of B, C, N, P, Ge, oxygen (O), Xe, or like materials. The magnetic material of the IC structure 300 may be doped with other suitable species in other embodiments.

Although the profiles of the doped portions 310a, 308a are depicted as rectangular in the figures, the portions 310a, 308a may have other suitably shaped profiles in other embodiments. Although the implanting (e.g., arrows 313) is depicted as being substantially perpendicular to the surfaces of the layers 308, 310 in FIG. 3b, in other embodiments, the implanting may approach from other angles.

Figure 3C:
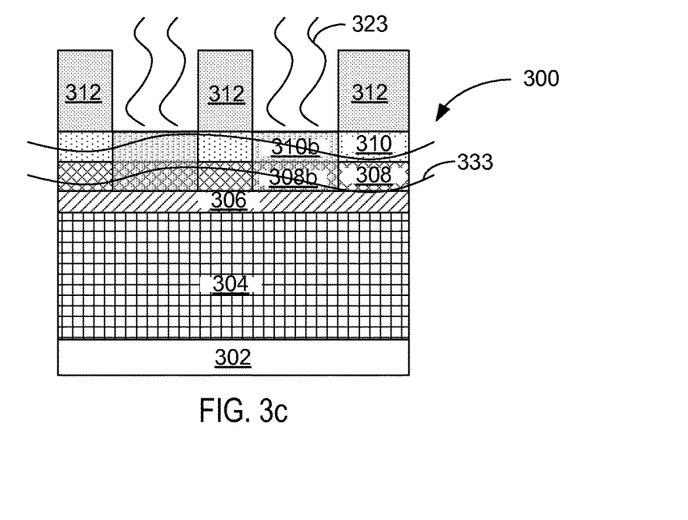

Referring to FIG. 3c, the IC structure 300 of FIG. 3b is depicted subsequent to magnetizing magnetizable material of the IC structure 300. For example, in some embodiments, an anneal process (e.g., heat indicated by lines 323) may be used in conjunction with application of a magnetic field (e.g., indicated by lines 333) to magnetize magnetizable material of the IC structure such as, for example, the magnetic layer 308 and/or the one or more magnetic base layers 304. In some embodiments, magnetization is inhibited (e.g., reduced or prevented) in the implanted portions 308a, 310a of FIG. 3b such that magnetization is inhibited in corresponding portions 308b, 310b of FIG. 3c. Subsequent to magnetization, a magnetic moment of portions 308b, 310b of FIG. 3c may be substantially or significantly less than a magnetic moment of other portions of the magnetic layer 308 and barrier layer 310. In some embodiments, the magnetization process may set a magnetic easy axis and cement magnetic pinning between adjacent materials. The magnetization process may include annealing the IC structure 300 at an elevated temperature while applying a magnetic field in some embodiments. For example, the anneal process may include application of a temperature greater than 300° C. while applying a magnetic field of ~1 Tesla. The magnetization process can include other suitable temperatures, magnetic fields, or other suitable processes in other embodiments.

Figure 3D:
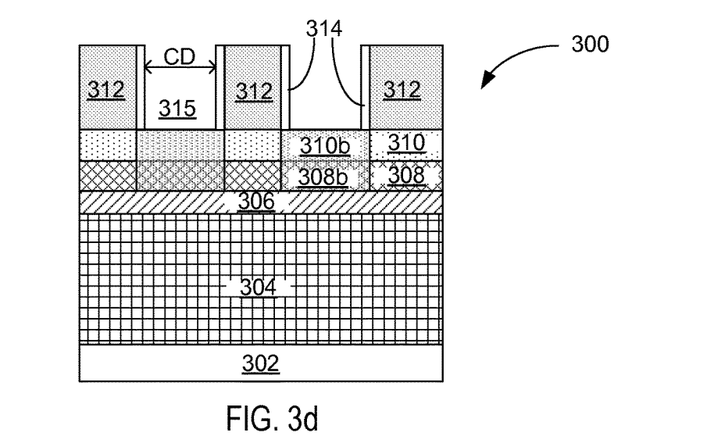

Referring to FIG. 3d, the IC structure 300 of FIG. 3c is depicted subsequent to forming spacers 314 on sidewalls of the patterned masking layer 312, as can be seen. The spacers 314 may be formed using any suitable technique, including patterning processes such as lithography and/or etch processes. In some embodiments, a bit size may be determined at least in part by a critical dimension (CD) across the opening 315 in the masking layer 312. The spacers 314 may facilitate subsequent etching (e.g., as described in connection with FIG. 3e) by allowing the etch to proceed with less precision on CD control and etch bias control.

The spacers 314 may be composed of any of a wide variety of suitable materials, including, for example, silicon nitride (SiN), silicon carbide (SiC), metal oxide dielectrics such as aluminum oxide ($Al_2O_3$), hafnium oxide ($HfO_2$), tantalum oxide ($Ta_2O_2$), or like materials. The spacers 314 may be composed of other suitable materials or may not be used at all in other embodiments.

Figure 3E:
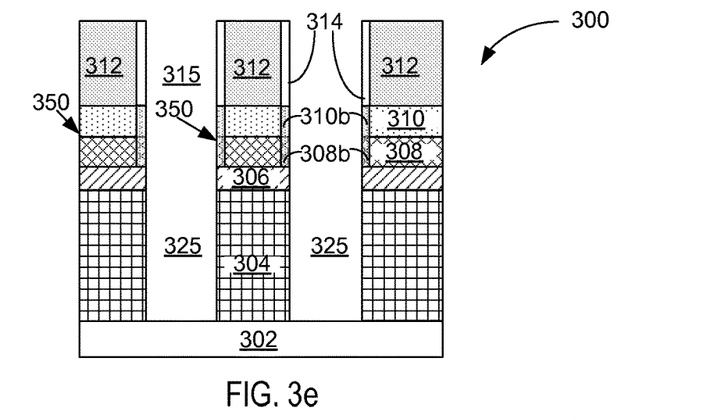

Referring to FIG. 3e, the IC structure 300 of FIG. 3d is depicted subsequent to performing an etch process to remove material of the IC structure 300 through the openings 315 in the masking layer 312, as can be seen. Portions of the stack of layers 304, 306, 308, 310, including portions of portions 308b and 310b, may be removed during the etching to form openings 325 and pillars 350 on the substrate 302, which may correspond with bits of MRAM in some embodiments. The etch process may include any suitable chemistry or technique to remove the materials of the IC structure 300, including, for example, reactive ion etch. Other suitable etch processes may be used in other embodiments.

In some embodiments, the portions 308b and 310b having a relatively lower magnetic moment may be more easily removed during the etch process than other portions of the layers 308 and 310 having a relatively higher magnetic moment. In some embodiments, the implantation may define with nanoscale precision which areas of the IC structure 300 are active (e.g., magnetized) and which areas are not (e.g., have substantially no magnetic moment or have a substantially lower magnetic moment than the magnetized areas). For example, each of the pillars 350 of the resulting IC structure 300 may include portions of layers 308, 310 having a relatively higher magnetic moment and portions 308b, 310b having a relatively lower magnetic moment where boundaries between the more magnetic and less magnetic portions are defined by the implantation.

Figure 3F:
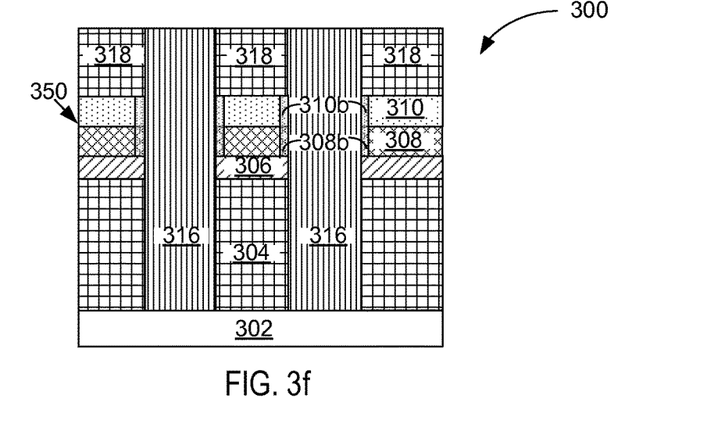

Referring to FIG. 3f, the IC structure 300 of FIG. 3e is depicted subsequent to forming an electrode 318 on the stack of layers 304, 306, 308, 310 of each pillar 350, as can be seen. In some embodiments, the openings 325 between the pillars 350 of FIG. 3e may be filled with a dielectric material 316 and an electrode 318 may be formed on the stack of layers 304, 306, 308, 310 using any suitable technique, including, for example, well-known patterning and planarizing processes. In some embodiments, the electrode 318 may include a metal via structure. In some embodiments, the dielectric material 316 may be in direct contact with implanted portions 308b, 310b that have a magnetic moment that is less than a magnetic moment of the magnetic layer 308 and barrier layer 310.

The electrode 318 may composed of any of a wide variety of suitable materials, including any of a wide variety of metals. The dielectric material 316 may be composed of any of a wide variety of suitable materials, including, for example, low-k dielectric material such as $SiO_2$, SiOCN, or like materials . The electrode 318 and the dielectric material 316 may be composed of other suitable materials in other embodiments.

Figure 4:
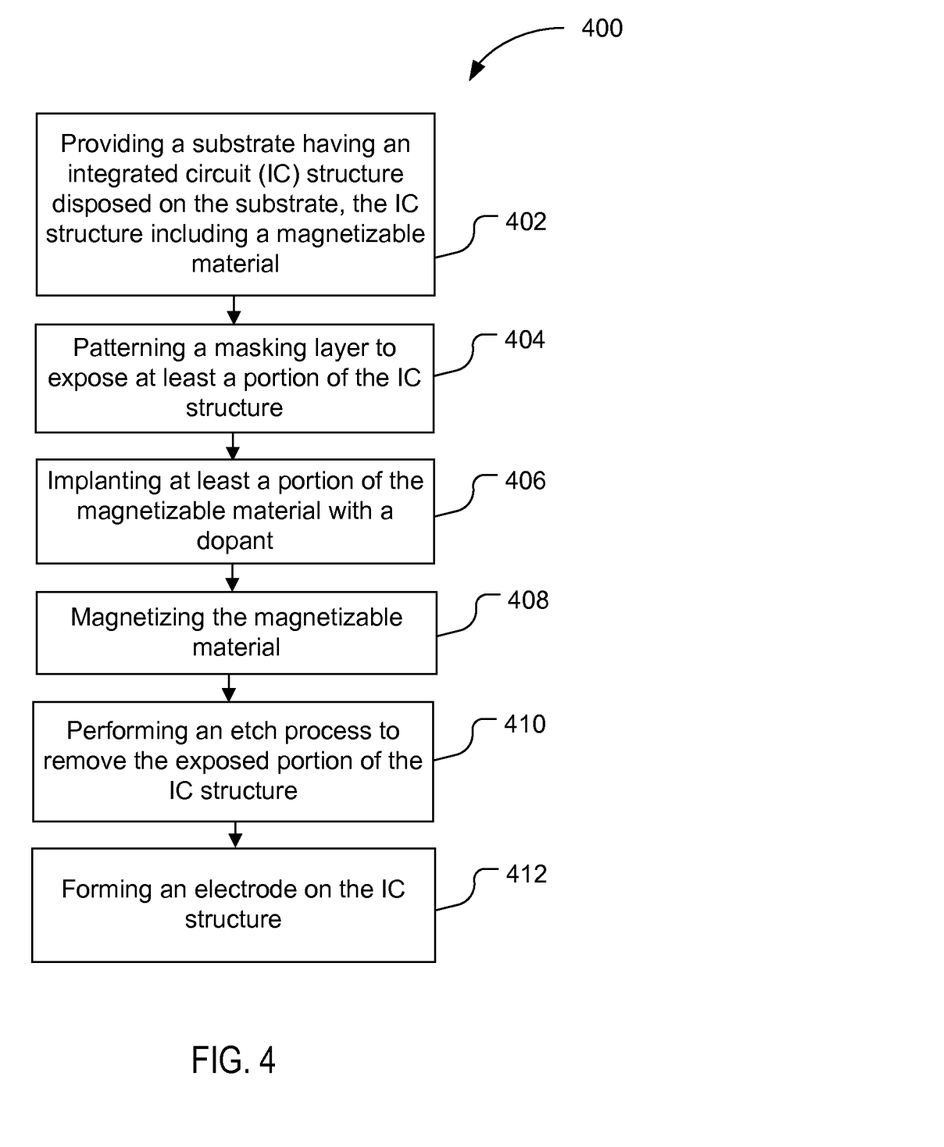
FIG. 4 schematically illustrates a flow diagram for a method of preventing magnetization of magnetizable material, in accordance with some embodiments.

FIG. 4 schematically illustrates a flow diagram for a method 400 of preventing magnetization of magnetizable material, in accordance with some embodiments. The method 400 may comport with techniques described in connection with FIGS. 1, 2, and/or 3a-f and vice versa.

At 402, the method 400 may include providing a substrate (e.g., substrate 302 of FIG. 3a) having an integrated circuit (IC) structure (e.g., IC structure of FIG. 3a) disposed on the substrate, the IC structure including a magnetizable material (e.g., magnetic layer 308 of FIG. 3a). In some embodiments, the providing the substrate having the IC structure may include forming the IC structure. For example, the IC structure may be formed by depositing one or more magnetic base layers (e.g., one or more magnetic base layers 304 of FIG. 3a) on the substrate, depositing a tunnel barrier layer (e.g., tunnel barrier layer 306 of FIG. 3a) on the one or more magnetic base layers, depositing a magnetic layer (e.g., magnetic layer 308 of FIG. 3a) on the tunnel barrier layer, and depositing a barrier layer (e.g., barrier layer 310 of FIG. 3a) on the magnetic layer. The IC structure may include other arrangements or configurations of magnetizable material in other embodiments.

At 404, the method 400 may include patterning a masking layer (e.g., masking layer 312 of FIG. 3a) to expose at least a portion of the IC structure. For example, the masking layer may include a hardmask layer that is deposited on the IC structure and patterned with openings (e.g., openings 315) to expose underlying portions of the IC structure.

At 406, the method 400 may include implanting (e.g., indicated by arrows 313 in FIG. 3b) at least a portion of the magnetizable material with a dopant. In some embodiments, the openings in the patterned mask layer may be configured to define with nanoscale precision which areas of the IC structure receive the implant. For example, the implant may be performed only in exposed portions of the IC structure underlying the openings in the patterned masking layer.

At 408, the method 400 may include magnetizing the magnetizable material. In some embodiments, magnetizing may be performed by annealing (e.g., indicated by lines 323 of FIG. 3c) the magnetizable material in the presence of a magnetic field (e.g., indicated by lines 333 of FIG. 3c). Other suitable techniques to magnetize the magnetizable material may be used in other embodiments. According to various embodiments, magnetizing may be inhibited in the implanted portion (e.g., portions 308a, 310a of FIG. 3b) of the magnetizable material. In this regard, magnetization of some of the magnetizable material may be prevented.

At 410, the method 400 may include performing an etch process to remove the exposed portion of the IC structure. For example, in some embodiments, spacers (e.g., spacers 314 of FIG. 3d) may be formed on sidewalls of the openings in the patterned masking layer to facilitate removal of portions of the IC structure through the openings. In some embodiments, the etch process may form openings (e.g., openings 325) between pillars (e.g., pillars 350 of FIG. 3e) that include layers (e.g., layers 304, 306, 308, and 310 of FIG. 3e) of the IC structure.

At 412, the method 400 may include forming an electrode (e.g., electrode 318 of FIG. 3f) on the IC structure. In some embodiments, the masking layer may be removed and a dielectric material (e.g., dielectric material 316 of FIG. 3f) may be deposited to fill the openings between the pillars. The dielectric material may be planarized and another dielectric material may be deposited on the IC structure and patterned to allow deposition of an electrode material onto the IC structure. In some embodiments, the electrode may be a bitline or another electrode of magnetic memory.

Figure 5:
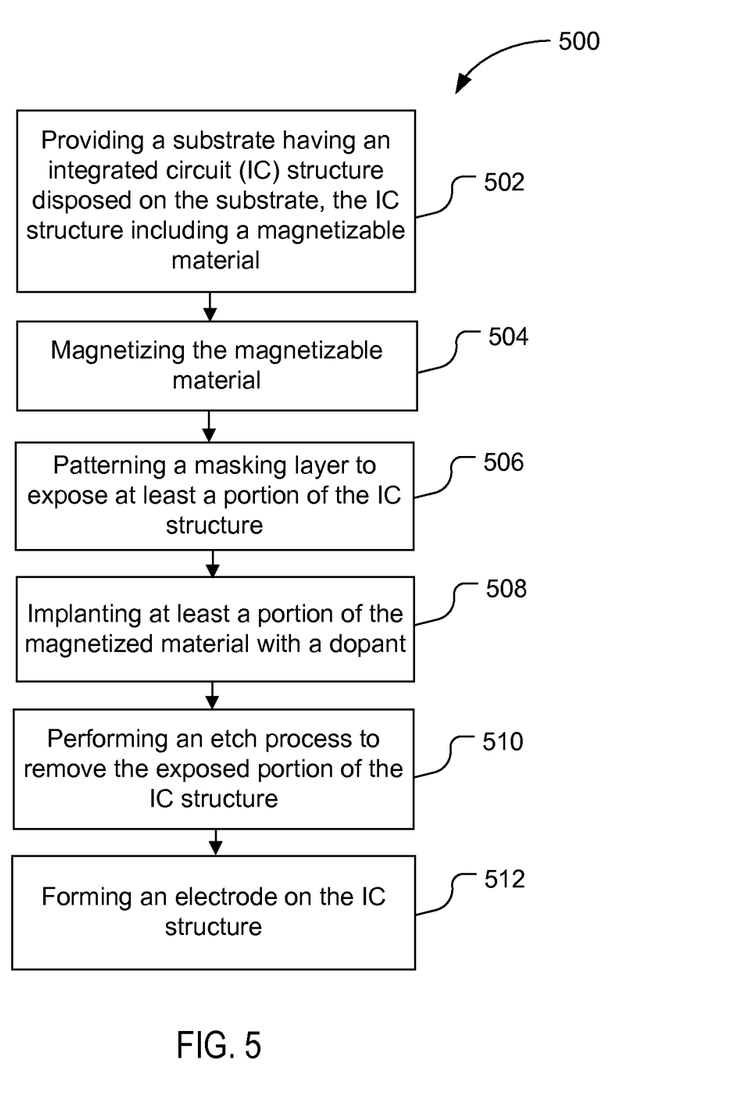
FIG. 5 schematically illustrates a flow diagram for a method of reducing magnetization of magnetized material, in accordance with some embodiments.

FIG. 5 schematically illustrates a flow diagram for a method 500 of reducing magnetization of magnetized material, in accordance with some embodiments. The method 500 may comport with embodiments described in connection with FIGS. 1-4 and vice versa.

At 502, the method 500 may include providing a substrate (e.g., substrate 302 of FIG. 3a) having an integrated circuit (IC) structure (e.g., IC structure 300 of FIG. 3a) disposed on the substrate, the IC structure including a magnetizable material (e.g., magnetic layer 308 of FIG. 3a). Providing the substrate having the IC structure at 502 may be performed according to techniques described in connection with 402 of method 400.

At 504, the method 500 may include magnetizing the magnetizable material. The actions at 504 may be performed according to techniques described in connection with actions at 408 of method 400.

At 506, the method 500 may include patterning a masking layer to expose at least a portion of the IC structure. The actions at 506 may comport with embodiments described in connection with actions at 404 of method 400.

At 508, the method 500 may include implanting at least a portion of the magnetized material with a dopant. The actions at 508 may comport with embodiments described in connection with actions at 406 of method 400. According to various embodiments, implanting may reduce a magnetic moment in the implanted portion of the magnetized material. In this regard, magnetization of the magnetized material may be reduced.

At 510, the method 500 may include performing an etch process to remove the exposed portion of the IC structure. The actions at 510 may comport with embodiments described in connection with actions at 410 of method 400.

At 512, the method 500 may include forming an electrode on the IC structure. The actions at 512 may comport with embodiments described in connection with actions at 412 of method 400.

Various operations are described as multiple discrete operations in turn, in a manner that is most helpful in understanding the claimed subject matter. However, the order of description should not be construed as to imply that these operations are necessarily order dependent. For example, according to various embodiments, magnetizing the magnetizable material at 504 may be performed prior to implanting at 508 and subsequent to patterning the masking layer at 506. In other embodiments, magnetizing the magnetizable material at 408 may be performed subsequent to actions at 410 or 412 of method 400.

Figure 6:
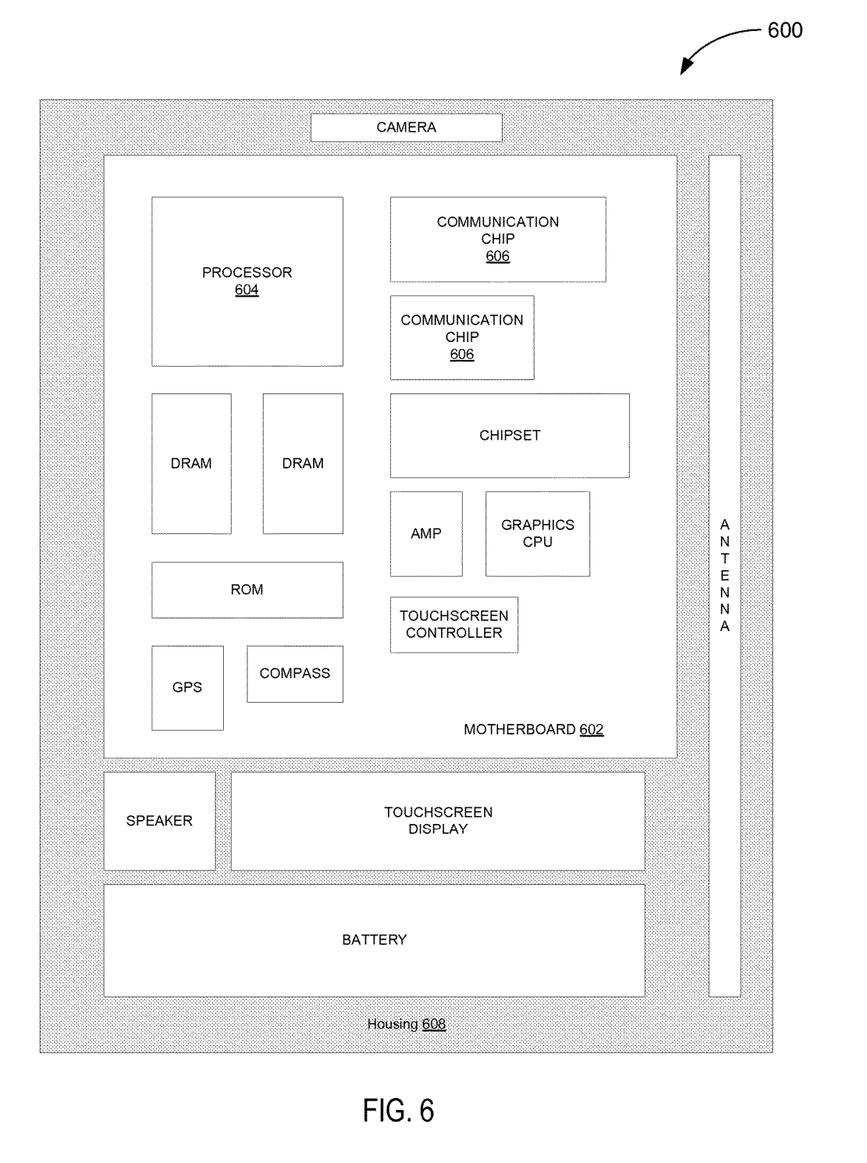
FIG. 6 schematically illustrates an example system that may include an IC structure as described herein, in accordance with some embodiments.

Embodiments of the present disclosure may be implemented into a system using any suitable hardware and/or software to configure as desired. FIG. 6 schematically illustrates an example system (e.g., computing device 600) that may include an IC structure (e.g., IC structure 300 of FIGS. 3a-f) as described herein, in accordance with some embodiments. The computing device 600 may house (e.g., in housing 608) a board such as motherboard 602. The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as a hard disk drive, compact disk (CD), digital versatile disk (DVD), and so forth).

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, EV-DO, and others.

The processor 604 of the computing device 600 may include a die (e.g., die 102 of FIGS. 1-2) having material with magnetic properties that are modulated as described herein (e.g., IC structure 300 of FIGS. 3*a-f*). For example, the die 102 of FIGS. 1-2 may be mounted in a package assembly that is mounted on the motherboard 602. The term "processor" may refer to any device or portion of a device that processes electronic data from registers and/or memory to transform that electronic data into other electronic data that may be stored in registers and/or memory.

The communication chip 606 may also include a die (e.g., die 102 of FIGS. 1-2) having material with magnetic properties that are modulated as described herein (e.g., IC structure 300 of FIGS. 3*a-f*). In further implementations, another component (e.g., memory device or another integrated circuit device) housed within the computing device 600 may contain a die (e.g., die 102 of FIGS. 1-2) having material with magnetic properties that are modulated as described herein (e.g., IC structure 300 of FIGS. 3*a-f*).

In various implementations, the computing device 600 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

EXAMPLES

According to various embodiments the present disclosure describes a method. Example 1 of a method includes providing a substrate having an integrated circuit (IC) structure disposed on the substrate, the IC structure including a magnetizable material, implanting at least a portion of the magnetizable material with a dopant, and magnetizing the magnetizable material, wherein said magnetizing is inhibited in the implanted portion of the magnetizable material. Example 2 may include the method of Example 1, wherein the substrate is a semiconductor substrate, the method further comprising forming the IC structure, wherein said forming the IC structure includes depositing the magnetizable material to form a magnetic layer of magnetic memory, the magnetizable material comprising a metal selected from a group consisting of cobalt (Co), iron (Fe), nickel (Ni), and an alloy of two or more of Co, Fe, or Ni with or without boron (B). Example 3 may include the method of Example 2, wherein forming the IC structure further comprises depositing one or more magnetic base layers on the substrate, depositing a tunnel barrier layer on the one or more magnetic base layers and depositing a barrier layer on the magnetic layer, wherein the magnetizable material is deposited on the tunnel barrier layer. Example 4 may include the method of any of Examples 1-3, wherein said implanting comprises implanting at least a portion of the IC structure with a dopant selected from a group consisting of boron (B), carbon (C), nitrogen (N), oxygen (O), phosphorous (P), germanium (Ge) and xenon (Xe). Example 5 may include the method of any of Examples 1-3, further comprising depositing a masking layer on the IC structure and patterning the masking layer to expose portions of the IC structure, wherein said implanting comprises implanting the exposed portions of the IC structure. Example 6 may include the method of Example 5, further comprising performing an etch process to remove material of the exposed portions of the IC structure. Example 7 may include the method of any of Examples 1-3, wherein said magnetizing is performed by annealing the magnetizable material in the presence of a magnetic field.

According to various embodiments the present disclosure describes another method. Example 8 of another method may include providing a substrate having an integrated circuit (IC) structure disposed on the substrate, the IC structure including a magnetizable material, magnetizing the magnetizable material, and implanting at least a portion of the magnetized material with a dopant to reduce a magnetic moment in the implanted portion of the magnetized material. Example 9 may include the method of Example 8, wherein the substrate is a semiconductor substrate, the method further comprising forming the IC structure, wherein said forming the IC structure includes depositing the magnetizable material to form a magnetic layer of magnetic memory, the magnetizable material comprising a metal selected from a group consisting of cobalt (Co), iron (Fe), nickel (Ni), and an alloy of two or more of Co, Fe, or Ni with or without boron (B). Example 10 may include the method of Example 9, wherein forming the IC structure further comprises depositing one or more magnetic base layers on the substrate, depositing a tunnel barrier layer on the one or more magnetic base layers, and depositing a barrier layer on the magnetic layer, wherein the magnetizable material is deposited on the tunnel barrier layer. Example 11 may include the method of any of Examples 8-10, wherein said implanting comprises implanting at least a portion of the IC structure with a dopant selected from a group consisting of boron (B), carbon (C), nitrogen (N), oxygen (O), phosphorous (P), germanium (Ge) and xenon (Xe). Example 12 may include the method of any of Examples 8-10, further comprising depositing a masking layer on the IC structure and patterning the masking layer to expose portions of the IC structure, wherein said implanting comprises implanting the exposed portions of the IC structure. Example 13 may include the method of Example 12, further comprising performing an etch process to remove material of the exposed portions of the IC structure. Example 14 may include the method of any of Examples 8-10, wherein said magnetizing is performed by annealing the magnetizable material in the presence of a magnetic field.

According to various embodiments the present disclosure describes an apparatus. Example 15 of an apparatus may include a substrate and an integrated circuit (IC) structure disposed on the substrate, the IC structure including a magnetic layer, wherein the magnetic layer has a first portion that is implanted with a dopant and a second portion that is not implanted with the dopant and the first portion has a magnetic moment that is less than a magnetic moment of the second portion. Example 16 may include the apparatus of Example 15, wherein the magnetic layer includes a metal selected from a group consisting of cobalt (Co), iron (Fe), nickel (Ni), and an alloy of two or more of Co, Fe, or Ni with or without boron (B). Example 17 may include the apparatus of Example 15, wherein the substrate is a semiconductor substrate and the IC structure further comprises one or more magnetic base layers disposed on the semiconductor substrate, a tunnel barrier layer disposed on the one or more magnetic base layers, and a barrier layer disposed on the magnetic layer, wherein the magnetic layer is disposed on the tunnel barrier layer. Example 18 may include the apparatus of any of Examples 15-17, further comprising a dielectric material in direct contact with the first portion of the magnetic layer. Example 19 may include the apparatus of any of Examples 15-17, further comprising an electrode disposed on the magnetic layer. Example 20 may include the apparatus of any of Examples 15-17, wherein the first portion of the magnetic layer has substantially no magnetic moment.

According to various embodiments the present disclosure describes a system (e.g., a computing device). Example 21 of a computing device may include a circuit board and a die coupled with the circuit board, the die including a substrate and an integrated circuit (IC) structure disposed on the substrate, the IC structure including a magnetic layer, wherein the magnetic layer has a first portion that is implanted with a dopant and a second portion that is not implanted with the dopant and the first portion has a magnetic moment that is less than a magnetic moment of the second portion. Example 22 may include the computing device of Example 21, wherein the die comprises magnetic random access memory (MRAM) and the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed, result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
   a substrate; and
   an integrated circuit (IC) structure disposed on the substrate, the IC structure including a magnetic layer, wherein:
      the magnetic layer has a first portion that is implanted with a dopant and a second portion that is not implanted with the dopant; and
      the first portion has a magnetic moment that is less than a magnetic moment of the second portion, wherein the magnetic moment of the first portion is non-zero;
      a tunnel barrier layer below the magnetic layer; and
      a barrier layer on the magnetic layer, wherein a portion of the barrier layer on the magnetic layer includes the dopant, and the tunnel barrier layer below the magnetic layer is free of the dopant.

2. The apparatus of claim 1, wherein:
   the magnetic layer includes a metal selected from a group consisting of cobalt (Co), iron (Fe), nickel (Ni), and an alloy of two or more of Co, Fe, or Ni with or without boron (B).

3. The apparatus of claim 1, wherein the substrate is a semiconductor substrate and the IC structure further comprises:
   one or more magnetic base layers disposed on the semiconductor substrate and below the tunnel barrier layer.

4. The apparatus of claim 1, further comprising:
   a dielectric material in direct contact with the first portion of the magnetic layer.

5. The apparatus of claim 1, further comprising:
   an electrode disposed on the magnetic layer.

6. A computing device comprising:
   a circuit board; and
   a die coupled with the circuit board, the die including:
      a substrate; and
      an integrated circuit (IC) structure disposed on the substrate, the IC structure including a magnetic layer, wherein:
         the magnetic layer has a first portion that is implanted with a dopant and a second portion that is not implanted with the dopant; and the first portion has a magnetic moment that is less than a magnetic moment of the second portion, wherein the magnetic moment of the first portion is non-zero;
a tunnel barrier layer below the magnetic layer; and
a barrier layer on the magnetic layer, wherein a portion of the barrier layer on the magnetic layer includes the dopant, and the tunnel barrier layer below the magnetic layer is free of the dopant.

7. The computing device of claim 6, wherein:
the die comprises magnetic random access memory (MRAM); and
the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

8. The computing device of claim 6, wherein the magnetic layer includes a metal selected from a group consisting of cobalt (Co), iron (Fe), nickel (Ni), and an alloy of two or more of Co, Fe, or Ni with or without boron (B).

9. The computing device of claim 6, wherein the die further comprises:
one or more magnetic base layers disposed on the substrate and below the tunnel barrier layer.

* * * * *